US012236996B2

(12) United States Patent
Lee et al.

(10) Patent No.: US 12,236,996 B2
(45) Date of Patent: Feb. 25, 2025

(54) MEMORY DEVICE AND REFRESH METHOD THEREOF

(71) Applicant: Samsung Electronics Co., Ltd., Suwon-si (KR)

(72) Inventors: Eun Ae Lee, Suwon-si (KR); Sunghye Cho, Suwon-si (KR); Kijun Lee, Suwon-si (KR); Kyomin Sohn, Suwon-si (KR); Myungkyu Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 99 days.

(21) Appl. No.: 18/197,084

(22) Filed: May 14, 2023

(65) Prior Publication Data

US 2023/0420027 A1    Dec. 28, 2023

(30) Foreign Application Priority Data

Jun. 27, 2022   (KR) .................. 10-2022-0078492
Sep. 6, 2022    (KR) .................. 10-2022-0112925

(51) Int. Cl.
    *G11C 11/406*    (2006.01)
(52) U.S. Cl.
    CPC .. *G11C 11/40622* (2013.01); *G11C 11/40615* (2013.01)
(58) Field of Classification Search
    CPC ............. G11C 11/40622; G11C 11/40615
    See application file for complete search history.

(56) References Cited

U.S. PATENT DOCUMENTS

| | | | |
|---|---|---|---|
| 9,032,141 B2 | 5/2015 | Bains et al. | |
| 9,286,964 B2 | 3/2016 | Halbert et al. | |
| 9,564,201 B2 | 2/2017 | Halbert et al. | |
| 9,685,240 B1 | 6/2017 | Park | |
| 9,761,298 B2 | 9/2017 | Halbert et al. | |
| 9,805,783 B2* | 10/2017 | Ito ..................... | G11C 29/783 |
| 10,600,470 B2 | 3/2020 | Bang | |
| 10,725,695 B2 | 7/2020 | Kim | |
| 10,811,077 B2 | 10/2020 | Shin et al. | |
| 10,860,222 B2 | 12/2020 | Shin et al. | |
| 11,049,544 B2 | 6/2021 | Devaux et al. | |
| 11,087,819 B2 | 8/2021 | Cowles et al. | |

(Continued)

FOREIGN PATENT DOCUMENTS

| | | |
|---|---|---|
| KR | 101731508 B1 | 5/2017 |
| KR | 101797639 B1 | 11/2017 |

(Continued)

*Primary Examiner* — Son L Mai
(74) *Attorney, Agent, or Firm* — Muir Patent Law, PLLC

(57) ABSTRACT

A memory device may include counters respectively corresponding to rows and each configured to count a number of accesses to a corresponding row, a refresh control circuit, a queue, and first flags respectively corresponding to the rows. The refresh control circuit may change a second flag set in a refresh period every refresh period, and determine whether to put an incoming row address into the queue based on a count value of a counter corresponding to a target row indicated by the incoming row address among the counters, a first flag value of a first flag corresponding to the target row among the first flags, and a second flag value of the second flag set in a current refresh period.

20 Claims, 9 Drawing Sheets

(56) References Cited

U.S. PATENT DOCUMENTS

| | | |
|---|---|---|
| 11,282,561 B2 | 3/2022 | Nale et al. |
| 12,118,221 B2 * | 10/2024 | Kim ..................... G06F 3/0632 |
| 2014/0156923 A1 | 6/2014 | Bains et al. |
| 2014/0177370 A1 | 6/2014 | Halbert et al. |
| 2016/0225434 A1 | 8/2016 | Halbert et al. |
| 2017/0092350 A1 | 3/2017 | Halbert et al. |
| 2019/0347019 A1 | 11/2019 | Shin et al. |
| 2022/0113868 A1 | 4/2022 | Cowles et al. |
| 2022/0165347 A1 | 5/2022 | Pan |

FOREIGN PATENT DOCUMENTS

| | | |
|---|---|---|
| KR | 102358563 B1 | 2/2022 |
| KR | 102385443 B1 | 4/2022 |

\* cited by examiner

MEMORY DEVICE AND REFRESH METHOD THEREOF

CROSS-REFERENCE TO RELATED APPLICATIONS

This application claims priority under 35 U.S.C. § 119 to Korean Patent Application Nos. 10-2022-0078492 filed on Jun. 27, 2022, and 10-2022-0112925 filed on Sep. 6, 2022, in the Korean Intellectual Property Office, the disclosure of each of which is incorporated herein by reference in its entirety.

BACKGROUND

1. Field

The disclosure relates to a memory device and a refresh method thereof.

2. Description of the Related Art

Volatile memory devices such as a dynamic random-access memory (DRAM) may store data by storing charges to a capacitor of a memory cell, and may read data by determining the charges stored in the capacitor. Because the charges stored in the capacitor leak over time, a memory device may periodically perform a refresh operation.

A memory controller connected to a memory device may access an address of the memory device randomly, and may access a particular address frequently or intensively. As the density of memory cells in the memory device increases, due to a voltage distribution of a row, the influence of charges in memory cells of an adjacent rows may increase. In particular, when an attack of intensively accessing a certain row is performed, due to a voltage of an active state of the certain row, data stored in memory cells of an adjacent row may be lost. This phenomenon is called "rowhammer." Therefore, it is desired that all rows of the memory device be monitored for rowhammer care.

SUMMARY

Some embodiments may provide a memory device and a refresh method thereof for defensing an attack.

According to some embodiments, a memory device including a plurality of counters, a plurality of first flags, a queue, and a refresh control circuit may be provided. The plurality of counters may correspond to a plurality of rows, respectively, and each of the plurality of counters may count a number of accesses to a corresponding row among the plurality of rows. The plurality of first flags may correspond to the plurality of rows, respectively. The queue may store a plurality of addresses. The refresh control circuit may change a second flag set in a refresh period every refresh period, and determine whether to put an incoming row address into the queue based on a count value of a counter, which corresponds to a target row indicated by the incoming row address among the plurality of rows, among the plurality of counters, a first flag value of a first flag corresponding to the target row among the plurality of first flags, and a second flag value of the second flag set in a current refresh period.

According to some embodiments, a memory device including a plurality of counters, a plurality of first flags, a queue, and a refresh control circuit may be provided. The plurality of counters may correspond to a plurality of rows, and each of the plurality of counters may count a number of accesses to a corresponding row among the plurality of rows. The plurality of first flags may correspond to the plurality of rows, respectively. The queue may store a plurality of addresses. The refresh control circuit may include a first comparing circuit, a second comparing circuit, and a control logic circuit. The first comparing circuit may compare a count value of a counter, which corresponds to a target row indicated by an incoming row address among the plurality of rows, among the plurality of counters with a first threshold. The second comparing circuit may compare a first flag value of a first flag corresponding to the target row among the plurality of first flags with a second flag value of a second flag set in a current refresh period. The control logic circuit may determine whether to put the incoming row address into the queue based on a plurality of comparison results including a comparison result of the first comparing circuit and a comparison result of the second comparing circuit.

According to some embodiments, a refresh method of a memory device including a plurality of rows may be provided. The refresh method may include receiving an incoming row address indicating a row to be activated among the plurality of rows, counting a number of accesses to a corresponding row among the plurality of rows, comparing a count value of the incoming row address with a threshold, comparing a first flag value of the incoming row address with a second flag value set in a current refresh period, determining whether to put the incoming row address into a queue when the count value reaches the threshold based on a difference between the first flag value and the second flag value, and determining a row address to be refreshed based on a row address stored in the queue.

DETAILED DESCRIPTION OF THE EMBODIMENTS

Figure 1:
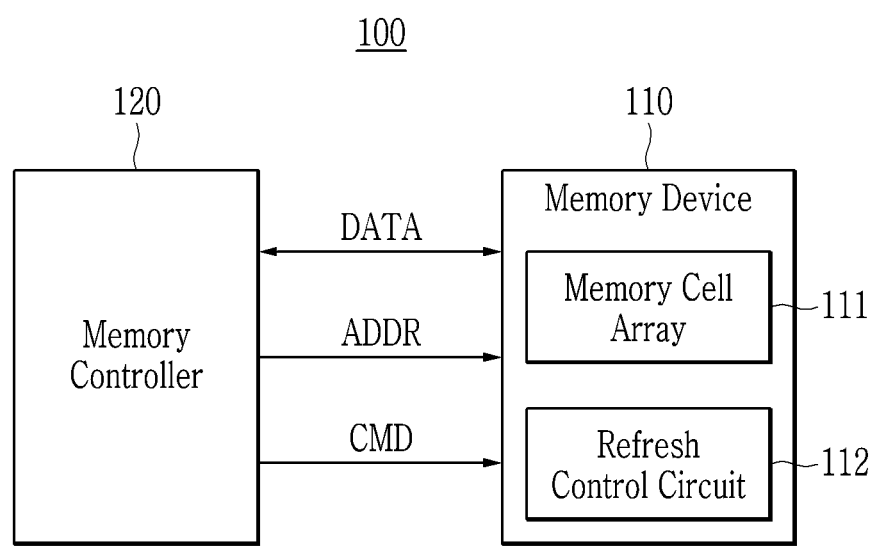
FIG. 1 is a block diagram of an example of a memory system according to an embodiment.

In the following detailed description, only certain embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation.

FIG. 1 is a block diagram of an example of a memory system according to an embodiment.

Referring to FIG. 1, a memory system 100 may include a memory device 110 and a memory controller 120. In some embodiments, the memory device 110 and the memory controller 120 may be connected through a memory interface to send and receive signals through the memory interface.

The memory device 110 may include a memory cell array 111 and a refresh control circuit 112. The memory cell array 111 may include a plurality of memory cells defined by a plurality of rows and a plurality of columns. In some embodiments, the rows may be defined by word lines and the columns may be defined by bit lines. The refresh control circuit 112 may detect an aggressor row from among the rows, determine a row address (referred to as a "victim row address") of a victim row to be refreshed based on a row address (referred to as an "aggressor row address") of the aggressor row, and output the victim row address. In some embodiments, the aggressor row may be a rowhammer aggressor row, and the victim row may be a row for rohammer care.

The memory controller 120 may control a memory operation of the memory device 110 by providing a signal to the memory device 110. The signal may include a command CMD and an address ADDR. In some embodiments, the memory controller 120 may provide the command CMD and the address ADDR to the memory device 110 to access the memory cell array 111 and control a memory operation such as read or write. Data may be transferred from the memory cell array 111 to the memory controller 120 according to a read operation, and data may be transferred from the memory controller 120 to the memory cell array 111 according to a write operation.

The command CMD may include an activate command, a read/write command, and a refresh command. In some embodiments, the command CMD may further include a precharge command. The activate command may be a command for activating a target row of the memory cell array 111 in order to write data to or read data from the target row the memory cell array 111. The read/write command may be a command for performing the read or write operation on a target memory cell of the activated row. The refresh command may be a command for performing a refresh operation in the memory cell array 111. In some embodiments, the refresh control circuit 112 may output a normal refresh command or a targeted refresh command in response to the refresh command. The targeted refresh command may be a refresh command that instructs an operation to refresh a victim row. Since the targeted refresh targets the victim row, it may be referred to as a "target row refresh" or a "forced refresh". The normal refresh command may be a refresh command that instructs a normal refresh operation, for example, an operation for sequentially refreshing rows of the memory cell array 111. The normal refresh may include, for example, an auto-refresh performed when the memory device 200 is in use and a self-refresh performed when the memory device 200 is in an idle state.

In some embodiments, the memory controller 120 may access the memory device 110 in response to a request from a host external to the memory system 100. The memory controller 120 may communicate with the host using various protocols.

The memory device 110 may be a storage device based on a semiconductor device. In some embodiments, the memory device 110 may include a DRAM device. In some embodiments, the memory device 110 may include other volatile or non-volatile memory devices for which the refresh operation is used.

Figure 2:
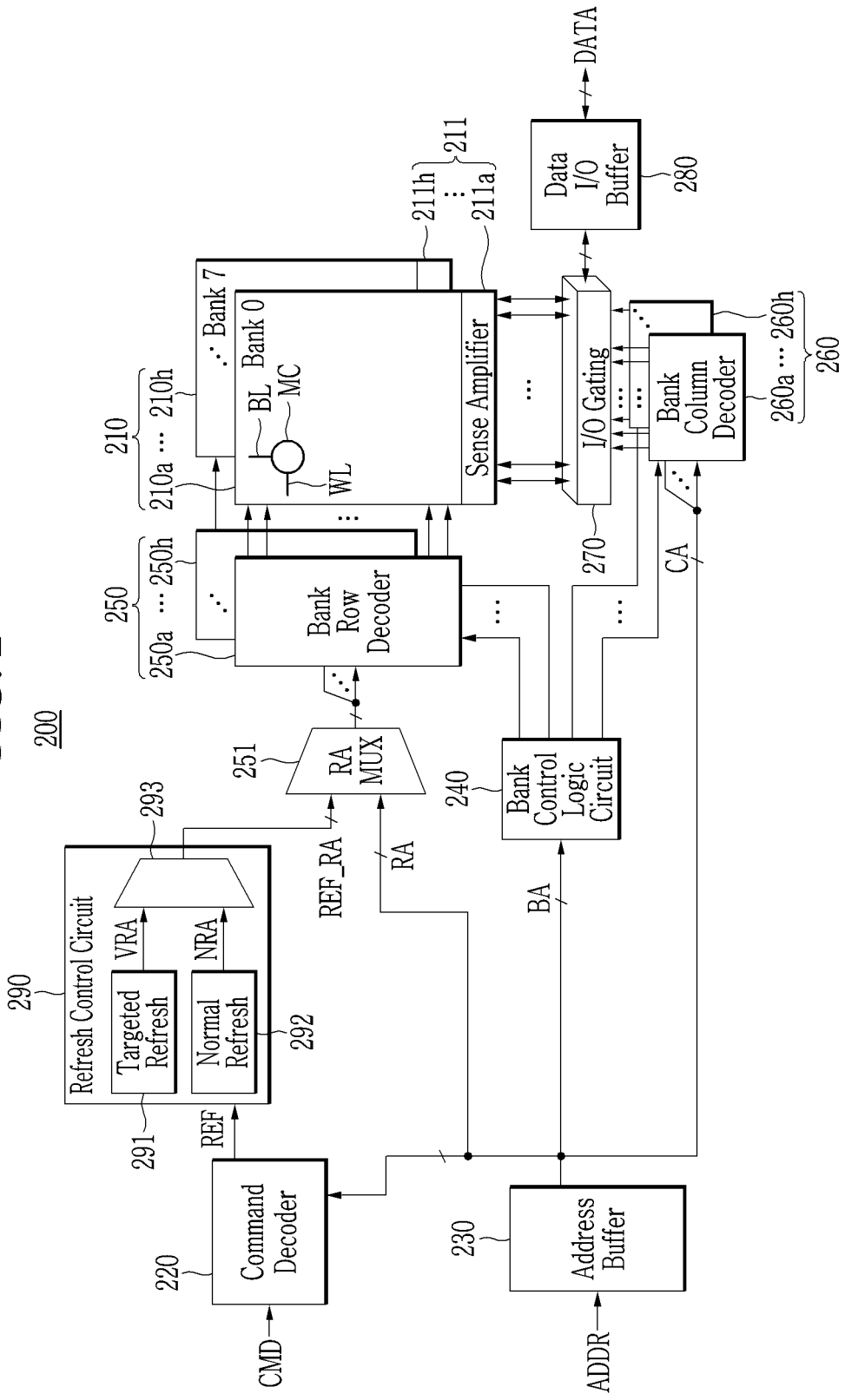
FIG. 2 is a block diagram of an example of a memory device according to an embodiment.

FIG. 2 is a block diagram of an example of a memory device according to an embodiment.

Referring to FIG. 2, a memory device 200 may include a memory cell array 210, a sense amplifier 211, a command decoder 220, an address buffer 230, a row decoder 250, a column decoder 260, an input/output (I/O) gating circuit 270, a data I/O buffer 280, and a refresh control circuit 290.

The memory cell array 210 may include a plurality of memory cells MC. In some embodiments, the memory cell array 210 may include a plurality of memory banks 210a to 210h. Although FIG. 2 shows eight memory banks 210a to 210h (Bank0 to Bank7), the number of memory banks is not limited thereto. Each of the memory banks 210a to 210h may include a plurality of rows, a plurality of columns, and a plurality of memory cells MC arranged at intersections of the plurality of rows and the plurality of columns. In some embodiments, the rows may be defined by a plurality of wordlines WL, and the columns may be defined by a plurality of bitlines BL.

The command decoder 220 may generate a control signal so that the memory device 200 may perform a read operation, a write operation, or a refresh operation. The command decoder 221 may generate a refresh command REF by decoding a command CMD received from a memory controller (e.g., 120 in FIG. 1).

The address buffer 230 may receive an address ADDR provided by the memory controller 120. The address ADDR may include a row address RA indicating a row of the memory cell array 210 and a column address CA indicating a column of the memory cell array 210. The row address RA may be provided to the row decoder 250, and the column address CA may be provided to the column decoder 260. The row address RA may be provided to the refresh control circuit 290 through the command decoder 220 or may be provided directly to the refresh control circuit 290. In some embodiments, the row address RA may be provided to the row decoder 250 via a row address multiplexer 251. In some embodiments, the address ADDR may further include a bank address BA indicating a memory bank.

In some embodiments, the memory device 200 may further include the row address multiplexer 251. The row address multiplexer 251 may receive the row address RA from the address buffer 230, and a refresh row address REF RA to be refreshed from the refresh control circuit 290. The row address multiplexer 251 may selectively output the row address RA received from the address buffer 230 and the refresh row address REF RA received from the refresh control circuit 290 to the row decoder 250.

The row decoder 250 may select a row to be activated from among the rows of the memory cell array 210 based on the row address RA or the refresh row address REF RA. The row decoder 250 may apply a driving voltage to a wordline corresponding to the row to be activated. In some embodiments, a plurality of bank row decoders 250a to 250h respectively corresponding to the memory banks 210a to 210h may be provided.

The column decoder 260 may select a column to be activated from among the columns of the memory cell array 210 based on the column address CA. The column decoder 260 may activate the sense amplifier 211 corresponding to the column address CA through the I/O gating circuit 270. In some embodiments, a plurality of bank column decoders 260a to 260h respectively corresponding to the memory banks 210a to 210h may be provided. In some embodiments, the I/O gating circuit 270 may gate I/O data, and may include a data latch that stores data read from the memory cell array 210 and a write driver that writes data to the memory cell array 210. The data read from the memory cell array 210 may be sensed by the sense amplifier 211 and stored in the I/O gating circuit 270 (e.g., the data latch). In some embodiments, a plurality of sense amplifiers 211a to 211h respectively corresponding to the memory banks 210a to 210h may be provided.

In some embodiments, the memory device 200 may further include a bank control logic circuit 240 that generates a bank control signal in response to the bank address BA. In response to the bank control signal, a bank row decoder corresponding to the bank address BA among the bank row decoders 250a to 250h may be activated, and a bank column decoder corresponding to the bank address BA among the bank column decoders 260a to 260h may be activated.

In some embodiments, the data read from the memory cell array 210 (e.g., the data stored in the data latch) may be provided to the memory controller 120 via the data I/O buffer 280. The data to be written to the memory cell array 210 may be provided from the memory controller 120 to the data I/O buffer 280, and the data provided to the data I/O buffer 280 may be provided to the I/O gating circuit 270.

The refresh control circuit 290 may transfer the refresh row address REF RA to be refreshed to the row decoder 250 in response to the refresh command REF. In some embodiments, the refresh control circuit 290 may include a targeted refresh control circuit 291, a normal refresh control circuit 292, and a refresh row address selector 293. The target refresh control circuit 291 may calculate a victim row address VRA based on the number of accesses of each row address, and may output the victim row address VRA in response to a targeted refresh command. The targeted refresh command may be a rowhammer refresh command. The normal refresh control circuit 292 may calculate a row address NRA on which a normal refresh operation is to be performed, and may output the row address NRA in response to a normal refresh command. The refresh row address selector 293 may selectively output the victim row address VRA from the targeted refresh control circuit 291 or the row address NRA from the normal refresh control circuit 292. In some embodiments, the refresh row address selector 293 may output the row address NRA from the normal refresh control circuit 292 as the refresh row address REF RA in response to the normal refresh command, and may output the victim row address VRA from the targeted refresh control circuit 291 as the refresh row address REF RA in response to the targeted refresh command.

Figure 3:
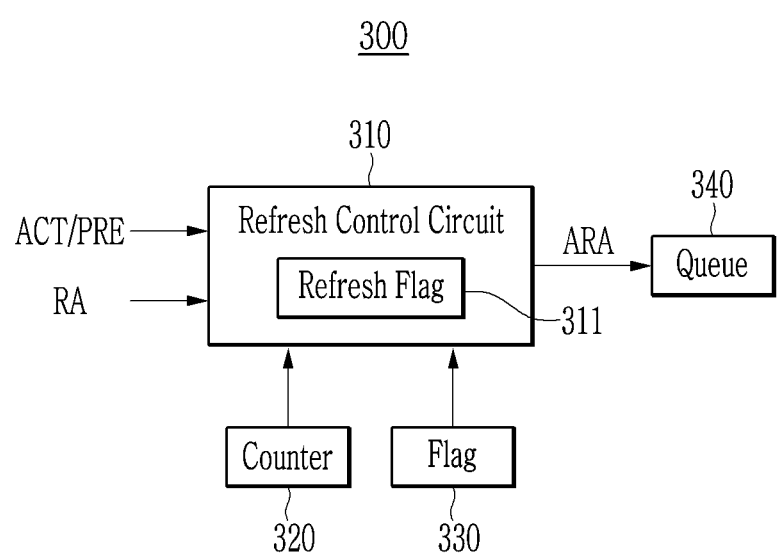
FIG. 3 is a block diagram showing an example of a memory device according to an embodiment.
Figure 4:
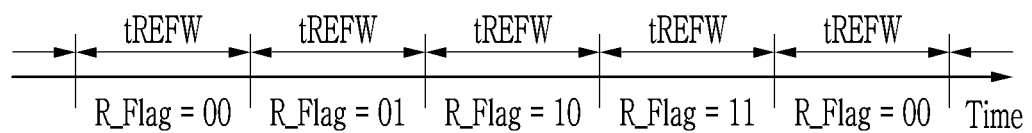
FIG. 4 is a diagram showing an example of a refresh period in a memory device according to an embodiment.

FIG. 3 is a block diagram showing an example of a memory device according to an embodiment, and FIG. 4 is a diagram showing an example of a refresh period in a memory device according to an embodiment.

Referring to FIG. 3, a memory device 300 may include a refresh control circuit 310, a plurality of counters 320, a plurality of flags 330, and a queue 340. In some embodiments, the refresh control circuit 310 of FIG. 3 may correspond to the targeted refresh control circuit (e.g., 291 of FIG. 2).

The counters 320 may correspond to a plurality of rows of a memory cell array (e.g., 111 in FIG. 1 or 210 in FIG. 2), respectively. Each counter 320 may count the number of accesses to a corresponding row and store a count value, and may have a plurality of bits. Each time a row address (hereinafter referred to as "incoming row address") RA of a row to be activated in the memory cell array (111 or 210) is received from a memory controller (e.g., 120 in FIG. 1), the count value of the counter 320 corresponding to the incoming row address RA may be updated (e.g., increased). The flags 330 may correspond to the rows of the memory cell array, respectively. Each flag 330 may store a flag value of a corresponding row, and may have a plurality of bits.

The queue 340 may store an aggressor row address ARA. In some embodiments, the queue 340 may output a predetermined number (e.g., one) of the aggressor row addresses ARA from among stored aggressor row addresses ARA in response to a targeted refresh command. The queue 340 may be implemented as, for example, a flip-flop, a latch, a buffer circuit, or a static random-access memory (SRAM), but is not limited thereto. For example, the queue 340 may store a plurality of addresses.

Referring to FIG. 4, the memory device 300 may manage a normal refresh so that each memory cell of a corresponding bank is refreshed every refresh period tREFW. In some embodiments, the refresh period tREFW may correspond to a normal refresh period, and may be, for example, a refresh window. The refresh control circuit 310 may set a refresh flag R_Flag in the refresh period tREFW and update the refresh flag R_Flag each time the refresh period tREFW changes. When the refresh flag R_Flag has a plurality of bits, the refresh control circuit 310 may update the refresh flag R_Flag by changing (for example, increasing) the refresh flag R_Flag by one each time the refresh period tREFW changes. In some embodiments, the number of bits in the refresh flag R_Flag may be equal to the number of bits in the flag 330. For example, when the refresh flag R_Flag has two bits, the refresh control circuit 310 may sequentially update the refresh flag R_Flag to "00", "01", "10", "11", and "00" each time the refresh period tREFW change.

Referring to FIG. 3 again, the refresh control circuit 310 may receive a count value of a counter (referred to as a "target counter") 320 corresponding to the incoming row address RA among the counters 320, and receive a flag value of a flag (referred to as a "target flag") 330 corresponding to the incoming row address RA among the flags 330, in response to a row operation command. In some embodiments, the row operation command may be an activation command ACT or a precharge command PRE. The refresh control circuit 310 may determine whether to put the incoming row address RA into the queue 340 as the aggressor row address ARA based on the count value, the flag value, and a flag value of a refresh flag (referred to as a "current refresh flag") 311 set in a current refresh period. In some embodiments, the refresh control circuit 310 may store the current refresh flag 311 in a device, which can store an updated value, for example, such as a counter or a register.

When the count value of the incoming row address RA, the flag value of the incoming row address RA, and the flag value of the current refresh flag 311 satisfy a predetermined condition, the refresh control circuit 310 may put the incoming row address RA into the queue 340 as the aggressor row address ARA. In some embodiments, the predetermined condition may include a condition in which the count value of the incoming row address RA reaches a first threshold and a difference between the flag value of the incoming row address RA and the flag value of the current refresh flag 311 is less than or equal to a predetermined value. In some embodiments, when the predetermined condition is satisfied, the refresh control circuit 310 may update the flag value of the incoming row address RA. In some embodiments, the refresh control circuit may update the flag value of the incoming row address RA by setting the flag value of the incoming row address RA to be equal to the flag value of the current refresh flag 311. Accordingly, the flag value of the target flag 330 corresponding to the incoming row address RA may be updated.

In some embodiments, the refresh control circuit 310 may maintain the flag value of the incoming row address RA without putting the incoming row address RA into the queue 340, when the count value of the incoming row address RA reaches the first threshold but the difference between the flag value of the incoming row address RA and the flag value of the current refresh flag 311 is greater than the predetermined value.

In some embodiments, the refresh control circuit 310 may update the flag value of the incoming row address RA without putting the incoming row address RA into the queue 340 when the count value of the incoming row address RA is less than or equal to a second threshold that is less than the first threshold.

In some embodiments, the refresh control circuit 310 may maintain the flag value of the incoming row address RA without putting the incoming row address RA into the queue 340 when the count value of the incoming row address RA is greater than the second threshold but does not reach the first threshold.

The refresh control circuit 310 may extract a predetermined number (e.g., one) of row addresses from the queue 340 when a targeted refresh command is received, and determine a victim row address based on the extracted row address. Accordingly, the memory device may refresh a victim row indicated by the victim row address. The refresh control circuit 310 may determine a row adjacent to an aggressor row indicated by the aggressor row address as the victim row. In some embodiments, the victim row may include a predetermined number of rows physically adjacent to the aggressor row. For example, when the aggressor row is an $m^{th}$ row and the predetermined number is two, the victim row may include an $(m+1)^{th}$ row and an $(m-1)^{th}$ row. Alternatively, when the aggressor row is an $m^{th}$ row and the predetermined number is four, the victim row may include an $(m+2)^{th}$ row, an $(m+1)^{th}$ row, an $(m-1)^{th}$ row, and an $(m-2)^{th}$ row.

As described above, the refresh control circuit 310 may prevent the queue 340 from overflowing by not putting a row address that has managed by the normal refresh into the queue 340 even if the number of accesses to the row is large. In particular, when the number of accesses for all rows of the memory cell array is managed, the queue 340 may be highly likely to overflow due to a large number of rows. However, by not putting the row addresses managed by the normal refresh into the queue 340, the queue 340 may be prevented from overflowing. Accordingly, the memory device 300 may efficiently perform the targeted refresh by preventing a warning due to the overflow of the queue 340 from occurring and by not putting row addresses of rows, on which the targeted refresh does not need to be performed due to the normal refresh, into the queue.

Next, a refresh method of a memory device according to an embodiment is described with reference to FIG. 5 and FIG. 6.

Figure 5:
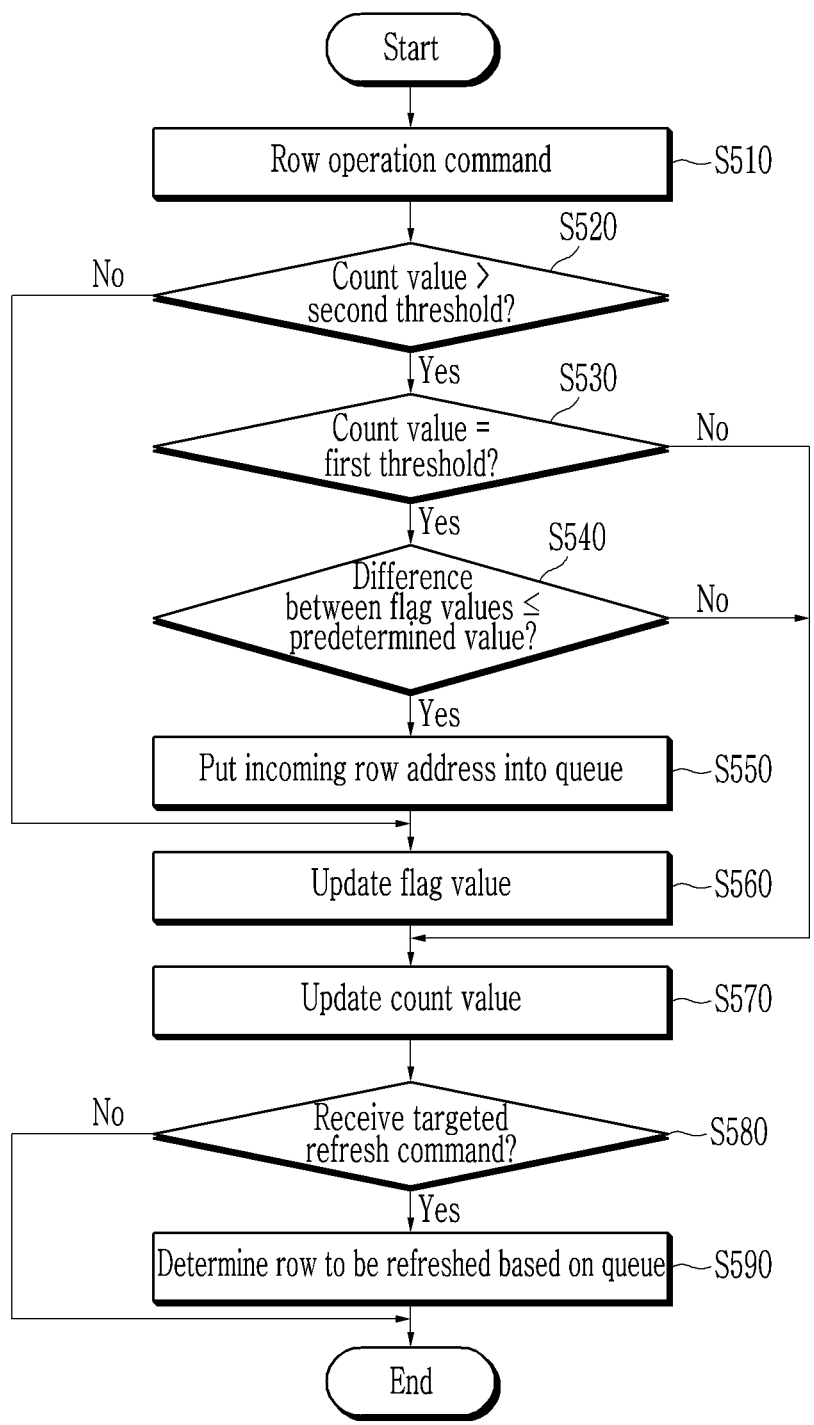
FIG. 5 is a flowchart showing an example of a refresh method of a memory device according to an embodiment.
Figure 6:
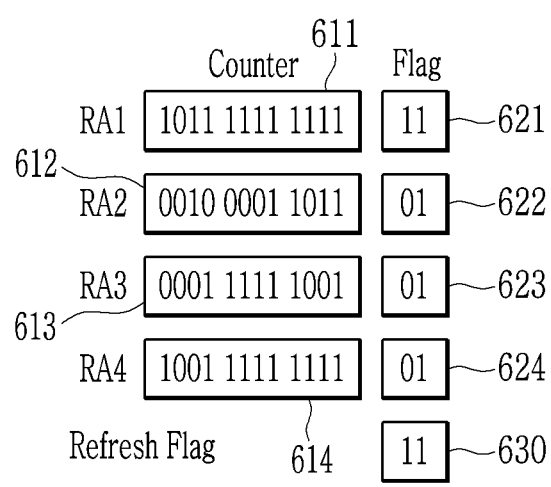
FIG. 6 is a diagram showing an example of row addresses used in a refresh method shown in FIG. 5 according to an embodiment.

FIG. 5 is a flowchart showing an example of a refresh method of a memory device according to an embodiment, and FIG. 6 is a diagram showing an example of row addresses used in a refresh method shown in FIG. 5.

For convenience, four example rows (i.e., row addresses RA1, RA2, RA3, and RA4), and counters and flags to them are shown in FIG. 6. It is assumed that a count value 611 of "101111111111" and a flag value 621 of "11" are stored in the counter and the flag corresponding to the row address RA1, respectively; a count value 612 of "001000011011" and a flag value 622 of "01" are stored in the counter and the flag corresponding to the row address RA2, respectively; a count value 613 of "000111111001" and a flag value 623 of "01" are stored in the counter and the flag corresponding to the row address RA3, respectively; and a count value 614 of "100111111111" and a flag value 624 of "01" are stored in the counter and the flag corresponding to the row address RA4, respectively. Further, it is assumed that a first threshold is 512 and a second threshold is 460, which is approximately (9/10) of the first threshold. Furthermore, it is assumed that a flag value (referred to as a "current refresh flag value") 630 of a refresh flag in a current refresh period is "11".

Referring to FIG. 5, a memory device, for example, a refresh control circuit may receive a count value and a flag value of an incoming row address in response to a row operation command in S510. In some embodiments, the row operation command may be an activation command or a precharge command. The refresh control circuit may compare the count value of the incoming row address with a threshold in S520 and S530. The threshold may include a first threshold and a second threshold less than the first threshold.

When the count value of the incoming row address does not exceed the second threshold in S520 (No), the refresh control circuit may update the flag value of the incoming row address to be equal to the current refresh flag value in S560, and update (e.g., increase) the count value of the incoming row address without putting the incoming row address RA into the queue 340 in S570. In some embodiments, the refresh control circuit may determine whether the count value exceeds the second threshold by comparing a predetermined number of least significant bits in the count value with the second threshold in S520. The refresh control circuit may determine that the count value does not exceed the second threshold when the count value is equal to or less than the second threshold. A case in which the count value is equal to or less than the second threshold may be interpreted as a case in which the count value is less than a threshold obtained by adding one to the second threshold. In some embodiments, since the number of accesses of the incoming row address is increased by reception of the incoming row address, the refresh control circuit may compare the increased count value (i.e., the increased number of accesses) with the second threshold. In some embodiments, the refresh control circuit may compare the count value before being increased with the second threshold. In this case, the second threshold may be set to a threshold obtained by subtracting one from the second threshold compared with the increased count value. For example, as shown in FIG. 6, the count value 612 of the incoming row address RA2 does not exceed the second threshold of 460 because the lowest nine bits of "001000011011" are "000011011". Accordingly, the refresh control circuit may update the flag value 622 of the incoming row address RA2 to "11", which is the current refresh flag value. In addition, the refresh control circuit may increase the count value 612 of the counter of the incoming row address RA2 to "001000011100". As such, when the count value is less than the second threshold, the corresponding row address may be in a low level of disturbance. Accordingly, the refresh control circuit may update the flag value 622 to the current refresh flag value 630, so that the corresponding row address RA2 may be treated as being refreshed by a normal refresh in the current refresh cycle.

When the count value of the incoming row address exceeds the second threshold in S520 (Yes) but does not reach the first threshold in S530 (No), the refresh control circuit may update the count value of the incoming row address without updating the flag value of the incoming row address without putting the incoming row address RA into the queue 340 in S570. Although not shown, in some embodiments, when the count value of the incoming row address exceeds the second threshold in S520 (Yes) but does not reach the first threshold in S530 (No), the refresh control circuit may update the flag value of the incoming row address RA without putting the incoming row address RA into the queue 340 in S560. In some embodiments, the refresh control circuit may determine whether the count value reaches the first threshold by comparing a predetermined number of least significant bits in the count value with the first threshold in S530. The refresh control circuit may determine that the count value reaches the first threshold when the count value is equal to the first threshold. A case in which the count value is equal to the first threshold may be interpreted as a case in which the count value exceeds a threshold obtained by subtracting one from the first threshold. In some embodiments, since the number of accesses of the incoming row address is increased by reception of the incoming row address, the refresh control circuit may compare the increased count value (i.e., the increased number of accesses) with the first threshold. In some embodiments, the refresh control circuit may compare the count value before being increased with the first threshold. In this case, the first threshold may be set to a threshold obtained by subtracting one from the first threshold compared with the increased count value. For example, as shown in FIG. 6, the count value 613 of the incoming row address RA3 exceeds the second threshold of 460 but does not reach the first threshold of 512 because the lowest nine bits of "000111111001" are "111111001". Accordingly, the refresh control circuit may increase the count value 613 of the counter of the incoming row address RA3 to "000111111010" without updating the flag value 623 of the incoming row address RA3. In this way, the refresh control circuit may determine that the incoming row address RA3 is being accessed continuously in the same refresh period by not updating the flag value 623.

When the count value of the incoming row address reaches the first threshold in S530, the refresh control circuit may compare the flag value of the incoming row address with the current refresh flag value in S540. When a difference between the flag value of the incoming row address and the current refresh flag value is greater than a predetermined value in S540 (No), the refresh control circuit may update the count value of the incoming row address without updating the flag value of the incoming row address in S570. Further, the refresh control circuit may not put the incoming row address into a queue. A case where the difference between the flag value of the incoming row address and the current refresh flag value is greater than the predetermined value may be interpreted as a case in which the difference between the flag value of the incoming row address and the current refresh flag value is greater than or equal to a value obtained by adding one to the predetermined value. For example, as shown in FIG. 6, because the lowest nine bits of the count value ("100111111111") 614 of the incoming row address RA4 are "111111111", the $10^{th}$ bit of the count value 614 may be flipped, so the count value 614 of the incoming row address RA4 may reach the first threshold. In this case, the difference between "01", which is the flag value 624 of the incoming row address RA4, and "11", which is the current refresh flag value 630, is two, which is greater than a predetermined value (e.g., one). Accordingly, the refresh control circuit may increase the count value 614 of the counter of the incoming row address RA4 to "101000000000" without updating the flag value 624 of the incoming row address RA4. As such, when the difference between the flag values 624 and 630 is greater than the predetermined value (e.g., one), an additional refresh period may exist between a refresh period (flag value of "01") in which intensive accesses have been occurred and the current refresh period (flag value of "11"). Accordingly, the refresh control circuit may determine that the row indicated by the incoming row address RA4 is a row that has been previously managed by the normal refresh, and may not put the incoming row address RA4 into the queue.

On the other hand, since an attack may occur at an end of the previous refresh cycle, the refresh control circuit may not determine whether the flag value of the incoming row address and the current refresh flag value are the same, but may determine whether the difference between the flag value of the incoming row address and the current refresh flag value is less than or equal to the predetermined value. In some embodiments, when two bits are used as the flag, the predetermined value may be set to one. In some embodiments, when three or more bits are used as the flag, the predetermined value may be set to a value of one or more.

When the count value of the incoming row address reaches the first threshold in S530 and the difference between the flag value of the incoming row address and the current refresh flag value is less than or equal to the predetermined value in S540, the refresh control circuit may put the incoming row address into the queue in S550. Further, the refresh control circuit may update the flag value of the incoming row address in S560 and update the count value of the incoming row address in S570. For example, as shown in FIG. 6, since the lowest nine bits of the count value ("101111111111") 611 of the incoming row address RA1 are "111111111", the 10th bit of the count value 611 may be flipped, so the count value 611 of the incoming row address RA1 may reach the first threshold. In this case, the flag value 621 of "11" of the incoming row address RA1 may be equal to the current refresh flag value 630 of "11" (i.e., may be less than or equal to the predetermined value of one). Accordingly, the refresh control circuit may put the incoming row address RA1 into the queue and increase the count value 611 of the counter of the incoming row address RA1 to "110000000000". In this way, when the difference between the flag values 621 and 630 is less than or equal to the predetermined value (for example, one), the refresh control circuit may determine that the row indicated by the incoming row address RA1 is a row which has not been previously managed by the normal refresh, and may put the incoming row address RA1 into the queue.

When receiving a target refresh command in S580, the refresh control circuit may determine a row address to be refreshed based on address information stored in the queue (i.e., addresses stored in queue) in S590. The refresh control circuit may extract the row address from the queue, and determine a victim row address based on the extracted row address at S590.

Figure 7:
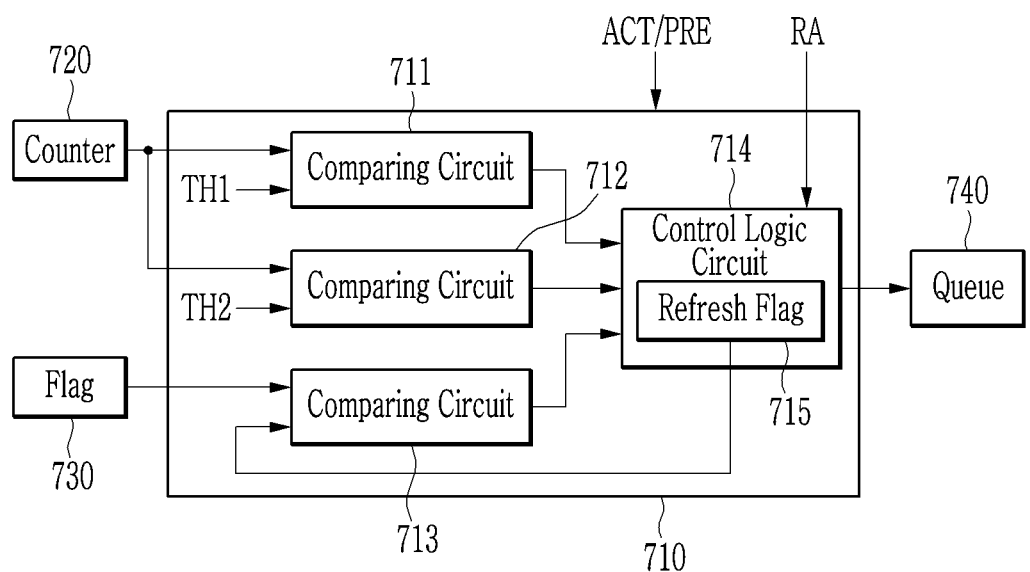
FIG. 7 is a block diagram showing an example of a memory device according to example embodiments.

FIG. 7 is a block diagram showing an example of a memory device according to example embodiments.

Referring to FIG. 7, a memory device 700 may include a refresh control circuit 710, a plurality of counters 720, a plurality of flags 730, and a queue 740. In some embodiments, the refresh control circuit 710 of FIG. 7 may correspond to a targeted refresh control circuit (e.g., 291 of FIG. 2).

The counters 720 may correspond to a plurality of rows of a memory cell array, respectively. Each counter 720 may count the number of accesses to a corresponding row and store a count value, and may have a plurality of bits. The flags 730 may correspond to the rows of the memory cell array, respectively. Each flag 730 may store a flag value of a corresponding row, and may have a plurality of bits.

The refresh control circuit 710 may include comparing circuits 711, 712, and 713, and a control logic circuit 714. In response to a row operation command such as an activation command ACT or a precharge command PRE, the refresh control circuit 710 may receive a counter value from a target counter 720 corresponding to a target row indicated by an incoming row address RA among the counters 720, and receive a flag value from a target flag 730 corresponding to the target row among the flags 730, under a control of the memory device 700.

The comparing circuit 711 may compare the count value of the target counter 720 with a first threshold TH1, and the comparing circuit 712 may compare the count value of the target counter 720 with a second threshold TH2. The second threshold TH2 may be smaller than the first threshold TH1. The comparing circuit 713 may compare the flag value of the target flag 730 with a flag value of a refresh flag 715 set in a current refresh period. The control logic circuit 714 may determine whether to put the incoming row address RA into the queue 740 based on comparison results of the comparing circuits 711, 712, and 713. The control logic circuit 714 may change the flag value of the refresh flag 715 every refresh period. The memory device 700 may update (i.e., increase) the count value of the target counter 720 when the incoming row address RA is received.

The control logic circuit 714 may perform an operation of putting the incoming row address into the queue 740, an operation of updating the flag value of the target flag 730, or an operation of maintaining the flag value of the target flag 730 without updating it, based on a condition satisfied by the comparison results of the comparing circuits 711, 712, and 713 among a plurality of conditions. When updating the flag value of the target flag 730, the control logic circuit 714 may update the flag value of the target flag 730 to be equal to the flag value of the refresh flag 715 set in the current refresh period.

When the comparison results of the comparing circuits 711, 712, and 713 satisfy a first condition, the control logic circuit 714 may put the incoming row address RA into the queue 740 and may update the flag value of the target flag 730. When the comparison results of the comparing circuits 711, 712, and 713 satisfy a second condition, the control logic circuit 714 may not put the incoming row address RA into the queue 740 and may update the flag value of the target flag 730. When the comparison results of the comparing circuits 711, 712, and 713 satisfy a third condition, the control logic circuit 714 may not put the incoming row address RA into the queue 740 and may maintain the flag value of the target flag 730.

In some embodiments, the first condition may include a condition in which the comparison result of the comparing circuit 711 indicates that the count value is equal to the first threshold TH1, and the comparison result of the comparing circuit 713 indicates that a difference between the flag value of the target flag 730 and the flag value of the refresh flag 715 is less than or equal to a predetermined value. The second condition may include a condition in which the comparison result of the comparing circuit 712 indicates that the count value is equal to or less than the second threshold TH2. The third condition may include a condition in which the comparison result of the comparing circuit 711 indicates that the count value is less than the first threshold TH1, and the comparison result of the comparing circuit 712 indicates that the count value is greater than the second threshold TH2, or a condition in which the comparison result of the comparing circuit 711 indicates that the count value is equal to the first threshold TH1, and the comparison result of the comparing circuit 713 indicates that the difference between the flag value of the target flag 730 and the flag value of the refresh flag 715 is greater than the predetermined value.

In some embodiments, the comparing circuits 711 and 712 may compare predetermined bits of the count value with the first threshold TH1 or the second threshold TH2. The predetermined bits may be, for example, a predetermined number of least significant bits.

Figure 8:
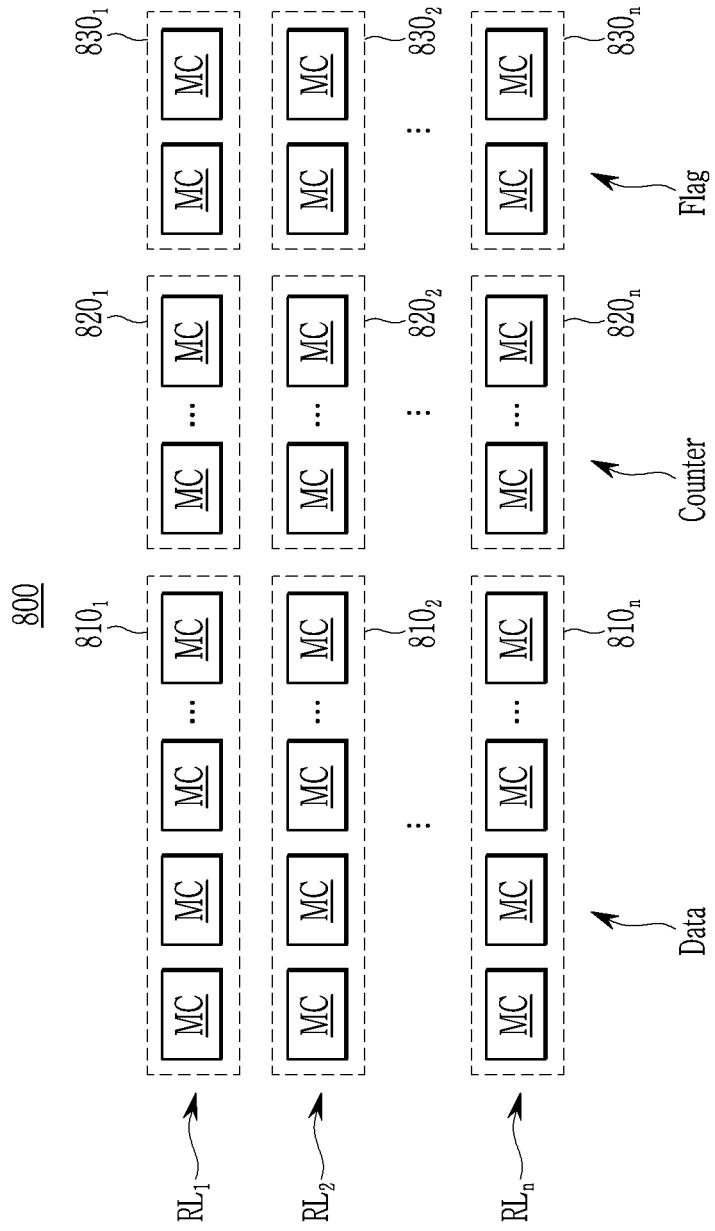
FIG. 8 is a diagram showing an example of a memory cell array of a memory device according to an embodiment.

FIG. 8 is a diagram showing an example of a memory cell array of a memory device according to an embodiment.

Referring to FIG. 8, a memory cell array 800 may include a plurality of rows $RL_1$, $RL_2$, . . . , and $RL_n$, and each row $RL_i$ may include a plurality of memory cells MC. Here, n indicates the number of rows, n is an integer greater than 1, and i is an integer between 1 and n. In each row $RL_i$, the memory cells MC may include a first group of memory cells $810_i$, a second group of memory cells $820_i$, and a third group of memory cells $830_i$. The first group of memory cells $810_i$ may be used to store data. The second group of memory cells $820_i$ may be used as a counter of the corresponding row $RL_i$, and the third group of memory cells $830_i$ may be used as a flag of the corresponding row $RL_i$. The number of memory cells belonging to the second group of memory cells $820_i$ may be determined based on a maximum count value of the counter, and the number of memory cells belonging to the third group of memory cells $830_i$ may be determined based on the number of bits of the flag. For example, as in an example shown in FIG. 6, when twelve bits are used as the count value and two bits are used as the flag, the second group of memory cells $820_i$ may include twelve memory cells MC, and the third group of memory cells $830_i$ may include two memory cells MC.

Accordingly, a memory device may manage the number of accesses for all rows $RL_1$ to $RL_n$ of the memory cell array 800 through the counter 8201 formed in each row $RL_i$, and the flag values of all rows $RL_1$ to $RL_n$ through the flag 8301 formed in each row $RL_i$.

Figure 9:
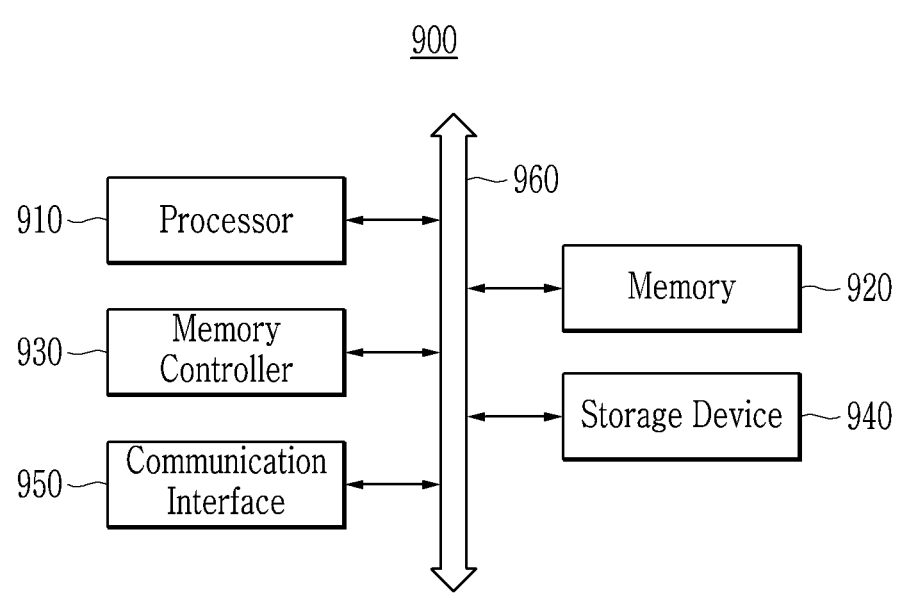
FIG. 9 is a block diagram showing an example of a computing device according to an embodiment.

FIG. 9 is a block diagram showing an example of a computing device according to an embodiment.

Referring to FIG. 9, a computing device 900 may include a processor 910, a memory 920, a memory controller 930, a storage device 940, a communication interface 950, and a bus 960. The computing device 900 may further include other components.

The processor 910 may control an overall operation of each component of the computing device 900. The processor 910 may be implemented with at least one of various processing units such as a central processing unit (CPU), an application processor (AP), and a graphic processing unit (GPU).

The memory 920 may store various data and instructions. The memory 920 may be implemented with the memory device described with reference to FIG. 1 to FIG. 8. The memory controller 930 may control transfers of data or instructions to and from the memory 920. The memory controller 930 may be implemented with the memory controller described with reference to FIG. 1 to FIG. 8. In some embodiments, the memory controller 930 may be provided as a separate chip from the processor 910. In some embodiments, the memory controller 930 may be provided as an internal component of the processor 910.

The storage device 940 may non-temporarily store programs and data. In some embodiments, the storage device 940 may be implemented as a non-volatile memory. The communication interface 950 may support wired or wireless Internet communication of the computing device 900. In addition, the communication interface 950 may support various communication methods other than Internet communication. The bus 960 may provide a communication function between the components of the computing device 1400. The bus 960 may include at least one type of bus according to a communication protocol between the components.

In some embodiments, each of the components, elements, modules, or units represented by a block as illustrated in FIG. 1 to FIG. 8 may be implemented as various numbers of hardware, software, and/or firmware structures that execute respective functions described above, according to embodiments. For example, at least one of these components, elements, modules, or units may include various hardware components including a digital circuit, a programmable or non-programmable logic device or array, an application specific integrated circuit (ASIC), or other circuitry using a digital circuit structure, such as a memory, a processor, a logic circuit, a look-up table, etc., that may execute the respective functions through controls of one or more microprocessors or other control apparatuses. Further, at least one of these components, elements, modules, or units may include a module, a program, or a part of code, which contains one or more executable instructions for performing specified logic functions, and executed by one or more microprocessors or other control apparatuses. Furthermore, at least one of these components, elements, modules, or units may further include or may be implemented by a processor such as a central processing unit (CPU) that performs the respective functions, a microprocessor, or the like. Functional aspects of embodiments may be implemented in algorithms that execute on one or more processors.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A memory device comprising:
   a plurality of counters respectively corresponding to a plurality of rows, and each configured to count a number of accesses to a corresponding row among the plurality of rows;
   a plurality of first flags respectively corresponding to the plurality of rows;
   a queue configured to store a plurality of addresses; and
   a refresh control circuit configured to:
   change a second flag set in a refresh period every refresh period, and
   determine whether to put an incoming row address into the queue based on:
      a count value of a counter, which corresponds to a target row indicated by the incoming row address among the plurality of rows, among the plurality of counters,
      a first flag value of a first flag corresponding to the target row among the plurality of first flags, and
      a second flag value of the second flag set in a current refresh period.

2. The memory device of claim 1, wherein, when the count value, the first flag value, and the second flag value satisfy a predetermined condition, the memory device is configured such that the refresh control circuit puts the incoming row address into the queue.

3. The memory device of claim 2, wherein the memory device is configured such that the refresh control circuit updates the first flag.

4. The memory device of claim 3, wherein the memory device is configured such that the refresh control circuit updates the first flag by setting the first flag value to be equal to the second flag value.

5. The memory device of claim 2, wherein the predetermined condition includes a condition in which the count value reaches a first threshold and a difference between the first flag value and the second flag value is less than or equal to a predetermined value.

6. The memory device of claim 5, wherein the refresh control circuit is further configured to determine a case where a predetermined number of least significant bits in the count value reaches the first threshold as a case where the count value reaches the first threshold.

7. The memory device of claim 5, wherein the predetermined value is one.

8. The memory device of claim 1, wherein, when the count value reaches a first threshold and a difference between the first flag value and the second flag value is greater than a predetermined value, the memory device is configured such that the refresh control circuit maintains the first flag value without putting the incoming row address into the queue.

9. The memory device of claim 1, wherein, when the count value is less than a first threshold and greater than a second threshold less than the first threshold, the memory device is configured such that the refresh control circuit maintains the first flag value without putting the incoming row address into the queue.

10. The memory device of claim 1, further comprising:
    a plurality of first memory cells formed in each of the plurality of rows and configured to store data,
    wherein each of the plurality of counters includes a plurality of second memory cells formed in a corresponding row among the plurality of rows and configured to store count value, and
    wherein each of the plurality of first flags includes a plurality of third memory cells formed in the corresponding row and configured to store the first flag value.

11. The memory device of claim 1, wherein the refresh control circuit is further configured to extract an aggressor row address from the queue in response to a targeted refresh command from an external device, and output a victim row address determined based on the aggressor row address as a row address to be refreshed.

12. A memory device comprising:
- a plurality of counters respectively corresponding to a plurality of rows, and each configured to count a number of accesses to a corresponding row among the plurality of rows;
- a plurality of first flags respectively corresponding to the plurality of rows;
- a queue configured to store a plurality of addresses; and
- a refresh control circuit including:
  - a first comparing circuit configured to compare a count value of a counter, which corresponds to a target row indicated by an incoming row address among the plurality of rows, among the plurality of counters with a first threshold,
  - a second comparing circuit configured to compare a first flag value of a first flag corresponding to the target row among the plurality of first flags with a second flag value of a second flag set in a current refresh period, and
  - a control logic circuit configured to determine whether to put the incoming row address into the queue based on a plurality of comparison results including a comparison result of the first comparing circuit and a comparison result of the second comparing circuit.

13. The memory device of claim 12, wherein the control logic circuit is further configured to change the second flag every refresh period.

14. The memory device of claim 12, wherein the incoming row address includes a first row address indicating a first row among the plurality of rows, and
wherein the memory device is configured such that the control logic circuit puts the first row address into the queue and updates the first flag corresponding to the first row among the plurality of first flags by setting the first flag value of the first flag corresponding to the first row to be equal to the second flag value, when:
- the count value of the counter corresponding to the first row among the plurality of counters reaches the first threshold, and
- a difference between the first flag value of the first flag corresponding to the first row and the second flag value is less than or equal to a predetermined value.

15. The memory device of claim 12, wherein the incoming row address includes a second row address indicating a second row among the plurality of rows, and
wherein the memory device is configured such that the control logic circuit maintains the first flag value of the first flag corresponding to the second row among the plurality of first flags without putting the second row address into the queue, when:
- the count value of the counter corresponding to the second row among the plurality of counters reaches the first threshold, and
- a difference between the first flag value of the first flag corresponding to the second row and the second flag value is greater than a predetermined value.

16. The memory device of claim 12, wherein the refresh control circuit further includes a third comparing circuit configured to compare the count value with a second threshold less than the first threshold,
wherein the plurality of comparison results further include a comparison result of the third comparing circuit,
wherein the incoming row address includes a second row address indicating a second row among the plurality of rows, and
wherein, when the count value of the counter corresponding to the second row among the plurality of counters is less than or equal to the second threshold, the memory device is configured such that the control logic circuit updates the first flag corresponding to the second row among the plurality of first flags by setting the first flag value of the first flag corresponding to the second row to be equal to the second flag value.

17. The memory device of claim 12, wherein the refresh control circuit further includes a third comparing circuit configured to compare the count value with a second threshold less than the first threshold,
wherein the plurality of comparison results further include a comparison result of the third comparing circuit,
wherein the incoming row address includes a second row address indicating a second row among the plurality of rows, and
wherein, when the count value of the counter corresponding to the second row among the plurality of counters is greater than the second threshold and is less than the first threshold, the memory device is configured such that the control logic circuit maintains the first flag value of the first flag corresponding to the second row among the plurality of first flags without putting the second row address into the queue.

18. The memory device of claim 12, wherein each of the plurality of counters includes a plurality of first memory cells formed in a corresponding row among the plurality of rows and configured to store the count value, and
wherein each of the plurality of first flags comprises a plurality of second memory cells formed in the corresponding row and configured to store the first flag value.

19. A refresh method of a memory device including a plurality of rows, the method comprising:
- receiving an incoming row address indicating a row to be activated among the plurality of rows;
- counting a number of accesses to a corresponding row among the plurality of rows;
- comparing a count value of the incoming row address with a threshold;
- comparing a first flag value of the incoming row address with a second flag value set in a current refresh period;
- determining whether to put the incoming row address into a queue when the count value reaches the threshold based on a difference between the first flag value and the second flag value; and
- determining a row address to be refreshed based on a row address stored in the queue.

20. The method of claim 19, further comprising changing the second flag value every refresh period.

* * * * *